United States Patent [19]

McKinnon et al.

[11] Patent Number: 4,918,387
[45] Date of Patent: Apr. 17, 1990

[54] MR SPECTROSCOPY METHOD

[75] Inventors: Graeme C. McKinnon, Zurich; Peter Bösiger, Ennetbaden, both of Switzerland

[73] Assignee: U.S. Philips Corporation, New York, N.Y.

[21] Appl. No.: 274,532

[22] Filed: Nov. 21, 1988

[30] Foreign Application Priority Data

Nov. 25, 1987 [DE] Fed. Rep. of Germany ....... 3739856

[51] Int. Cl.$^4$ ............................................ G01R 33/20
[52] U.S. Cl. .................................... 324/309; 324/307
[58] Field of Search ............... 324/300, 307, 308, 309, 324/310, 311, 312, 313

[56] References Cited

U.S. PATENT DOCUMENTS

| | | | |
|---|---|---|---|
| 4,532,473 | 7/1985 | Wehrli | 324/306 |
| 4,680,546 | 7/1987 | Dumoulin | 324/307 |
| 4,801,884 | 1/1989 | Oppelt et al. | 324/309 |
| 4,803,432 | 2/1989 | Perman | 324/307 |

OTHER PUBLICATIONS

D. A. Lampman et al., Improvements to Volume Selective 'H Spectroscopy With Solvent Suppression—S.M.R.M., vol. 3, pp. 981, 982 (1986).
G. A. Morris et al., Selective Execution in Fourier Transform Nuclear Magnetic Resonance, Journal of Magnetic Resonance, 29, p. 433 (1978).

Primary Examiner—Michael J. Tokar
Attorney, Agent, or Firm—Thomas A. Briody; Jack E. Haken; Jack D. Slobod

[57] ABSTRACT

MR spectroscopy method and apparatus in which an examination zone is exposed, preferably repeatedly, to a sequence which comprises a first binomial 90° RF pulse, a 180° RF pulse and a second binomial 90° RF pulse which sequence enables separate demonstration of the presence of either lactic acid or lipids in the presence of water. The periods in time between the two binomial RF pulses and the 180° RF pulse are equal and are approximately at least to the reciprocal value of four times the scalar coupling constant of lactic acid.

13 Claims, 3 Drawing Sheets

MR SPECTROSCOPY METHOD

BACKGROUND OF THE INVENTION

1. Field of the Invention

The invention relates to a magnetic resonance (MR) spectroscopy method in which an examination Zone is exposed, preferably repeatedly, to a sequence which comprises a first frequency-selective 90° RF pulse for water suppression, followed by a 180° RF pulse, and also relates to a device for performing this method.

2. Description of the Prior Art

A method of this kind is known from "Book of Abstracts" of S.M.R.M., Vol. 3, 1986, pp. 981 and 982. Therein, the frequency-selective 90° RF pulse in the form of a binomial pulse leaves the water-bound protons substantially unexcited but excites the protons bound to lactic acid. The presence of lactic acid in biological tissues thus can be demonstrated, even though the water signal is from three to four powers of ten larger than the signal produced by lactic acid if the 90° RF pulse is not a binomial pulse.

The 180° RF pulse succeeding the first binomial 90° RF Pulse serves to select a voxel, in cooperation with two further 180° RF pulses (each time in conjunction with a magnetic gradient field), and to determine the lactic acid contents in this voxel in conjunction with the binomial RF pulse.

The known method has been tested on a lactic acid phantom. In clinical practice, however, it is substantially more difficult to demonstrate the Presence of lactic acid, because in the frequency range in which the lactic acid signals occur a signal is also generated by lipids.

3. Object of the Invention

It is the object of the invention to provide a method of the kind set forth so that the presence of either lactic acids oz lipids can be separately demonstrated in the presence of water.

SUMMARY OF THE INVENTION

This object is achieved in accordance with the invention in that the non-selective 180° RF pulse is followed by a second frequency-selective 90° RF pulse for water suppression, the distances in time between the two RF pulses and the 180° RF pulse being the same and at least approximately equal to the reciprocal value of four times the scalar coupling constant of lactic acid.

After the first frequency-selective 90° RF pulse, in addition to the substantially attenuated water signal there are obtained signal components which depend on the lipid contents as well as on the lactic acid contents in the examination zone. After the second frequency-selective RF Pulse, either the component arising from the lipids is suppressed (when the second binomial RF pulse has the same phase position as the first one) or the lactic acid component is suppressed (when a phase difference of 90° exists between the two binomial RF pulses).

In a further version of the invention, the second frequency-selective RF pulse is followed by three 180° RF pulses in the presence of a resPective magnetic gradient field, the gradients of the magnetic gradient fields applied during these 180° RF pulses extending perpendicularly to one another. It is thus possible to select a given volume and to determine the lipid or lactic acid contents only for this volume.

In a further version of the invention, the first frequency-selective RF pulse is Preceded by a narrow-band 90° RF pulse having a frequency which corresponds to the Larmor frequency of water, between this RF pulse and the first binomial RF Pulse there being applied a magnetic gradient field for the purpose of dephasing. As a result, the signal component stemming from water in the examination zone is suppressed even further.

In a further version of the invention, the 180° RF pulse situated between the two frequency-selective RF pulses is inverted every other sequence. Thus, a correction is made for the errors induced by inaccuracies of the 180° RF pulse (because the nuclear magnetization is not rotated through exactly 180° by said pulse in all locations).

The invention will be described in detail hereinafter with reference to the drawings. Therein:

DETAILED DESCRIPTION OF THE PREFERRED EMBODIMENT

Figure 1:
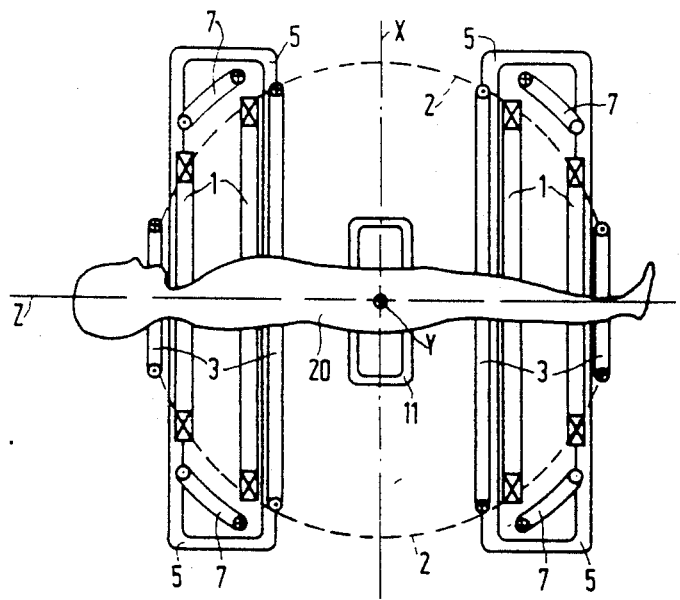
FIG. 1 shows an apparatus for medical MRI which is suitable for carrying out the method in accordance with the invention.

The MRI apparatus which is diagrammatically shown in FIG. 1 comprises a system consisting of four coils 1 for generating a uniform, steady magnetic field which may have a strength of from some tenths of T to a few T. This field extends in the z-direction of a cartesian co-ordinate system. The coils are concentrically arranged with respect to the z-axis and may be situated on a spherical surface 2. The patient 20 to be examined is arranged within these coils.

In order to generate a magnetic field Gz which extends in the z direction and which linearly varies in this direction there are provided four coils 3 which are preferably situated on the same spherical surface. There are also provided four coils 7 which generate a magnetic gradient field Gx (i.e. a magnetic field whose strength varies linearly in one direction) which also extends in the z-direction but whose gradient, extends in the x-direction. A magnetic gradient field Gy which extends in the z-direction with a gradient in the y-direction is generated by four coils 5 which may have the same shape as the coils 7 but which are arranged in a position rotated through 90° with respect thereto. Only two of these four coils are visible in FIG. 1.

Because each of the three coil systems 3, 5 and 7 for generating the magnetic gradient fields Gz, Gy and Gx is symmetrically arranged with respect to the spherical surface 2, the field strength in the centre of the sphere, being at the same time the origin of said cartesian xyz co-ordinate system, is determined only by the steady, uniform magnetic field of the coil system 1 Furthermore, an RF coil 11 is symmetrically arranged with respect to the plane z=0 of the coordinate system, which RF coil is constructed so that it generates an essentially uniform RF magnetic field which extends in the x direction, i e. perpendicularly to the direction of the steady, uniform magnetic field. The RF coil receives an RF modulated current from an RF generator during each RF pulse Subsequent to a sequence, the RF coil 11, or a separate RF receiver coil, serves for the reception of the nuclear resonance signals generated in the examination zone.

Figure 2:
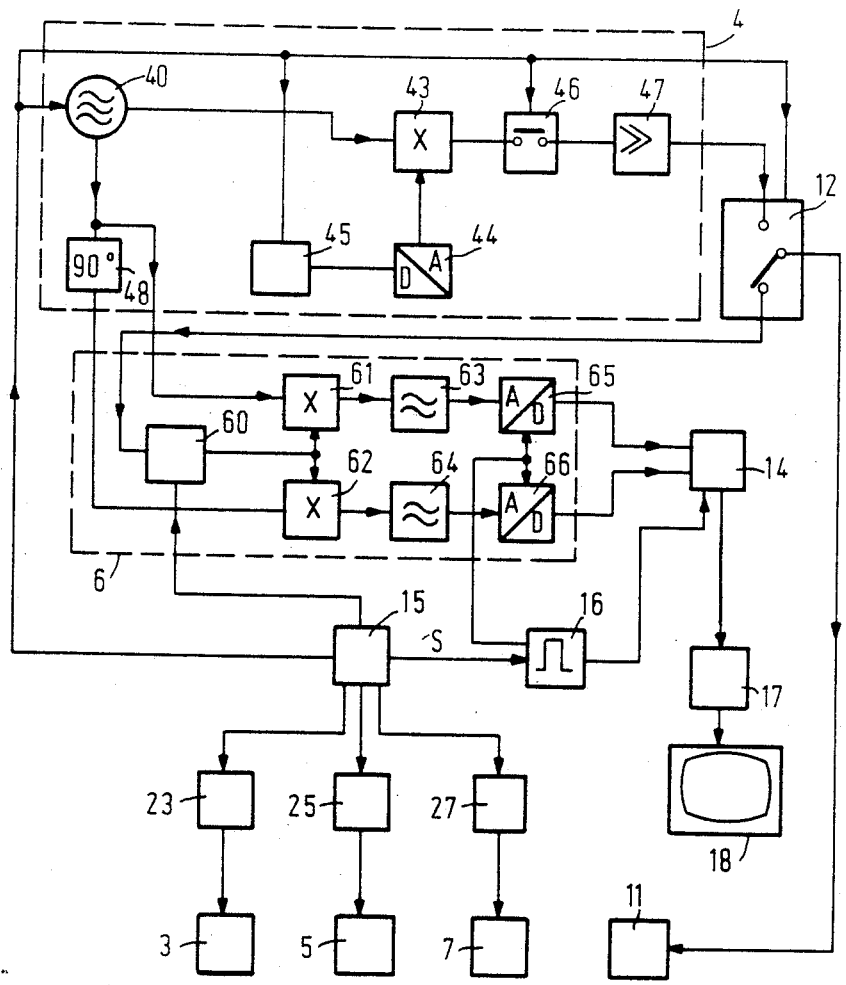
FIG. 2 shows a block diagram of such an apparatus.

FIG. 2 shows a simplified block diagram of this MRI apparatus. Via a switching device 12, the RF coil 11 is connected on the one side to an RF generator 4 and on the other side to an RF receiver 6.

The RF generator 4 comprises an RF oscillator 40 Whose frequency can be digitally controlled by means of a control unit 15 and which supplies oscillations of a frequency corresponding to the Larmor frequency of the nuclei to be excited at the field strength generated by the coils 1. As is known, the Larmor frequency f is calculated in accordance with the relation $f=cB$, where B is the magnetic induction in the steady, uniform magnetic field and c is the gyromagnetic ratio which, for example !or protons amounts to 42.56 mHz/t. The output of the oscillator 40 is connected to an input of a mixing stage 43. The mixing stage receives a second input signal from a digital-to-analog converter 44 whose output is connected to a digital memory 45. Under the control of the control device, a series of digital data words representing an envelope signal is read from the memory.

The mixing stage 43 processes the input signals applied thereto so that a carrier oscillation modulated by the envelope signal appears on its output. The output signal of the mixing stage 43 is applied, via a switch 46 which is controlled by the control device 15, to an RF power amplifier 47 whose output is connected to the switching device 12. This device is also controlled by the control device 15.

The receiver 6 comprises an RF amplifier 60 which is connected to the switching device and which receives the nuclear resonance signals generated in the RF coil 11; for this purpose the switching device must occupy the corresponding position. The amplifier 60 comprises a muting input which is controlled by the control device 15 and via which it can be blocked so that the gain is substantially zero. The output of the amplifier is connected to the first inputs of two multiplying mixing stages 61 and 62 which supply a respective output signal which corresponds to the respective product of their input signals. The second inputs of the mixing stages 61 and 62 receive a signal having the frequency of the oscillator 40, a phase shift of 90° existing between the signals on the two inputs. This phase shift is produced by means of a 90° phase shifter 48 whose output is connected to the input of the mixing stage 62 and whose input is connected to the input of the mixing stage 61 and to the output of the oscillator 40.

The output signals of the mixing stages 61 and 62 are applied to a respective analog-to-digital converter 65, 66, via low-pass filters 63 and 64 which suppress the frequency supplied by the oscillator 40 as well as all higher frequencies and which conduct low-frequency components. These converters convert the analog signals of the circuit 61 ... 64, forming a quadrature demodulator, into digital data words which are applied to a memory 14. The analog-to-digital converters 65 and 66 and the memory 14 receive their clock pulses from a clock pulse generator 16 which can be inhibited and enabled by the control device 15, via a control line, so that the signals supplied by the RF coil 11 and transposed to the low-frequency range can be converted into a series of digital data words for storage in the memory 14 only during a measuring interval defined by the control device 15.

The three coil systems 3, 5 and 7 are powered by current generators 23, 25 and 27 with a current whose variation in time can be controlled by the control unit 15.

The data words stored in the memory 14 are applied to an arithmetic device 17 which determines, therefrom using a discrete Fourier transformation, the spectrum of the nuclear magnetization for supply to a suitable display unit, for example a monitor 18.

Figure 3:
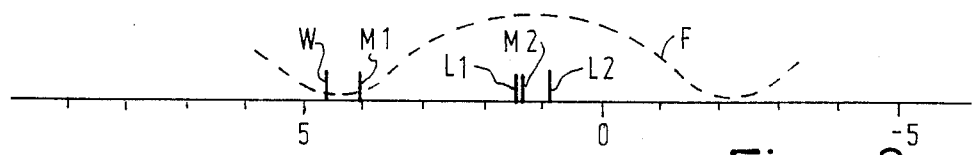
FIG. 3 shows the position of the spectral components of water, lactic acid and lipids.

FIG. 3 shows the position of the components which are of importance for the clinical examination on a frequency scale which indicates the frequency deviation, standardized to the Larmor frequency of TMS (tetramethylsilane) and with respect to the Larmor frequency of TMS. Thus, the Larmor frequency of TMS is zero whilst the Larmor frequency W of water is 4.7 ppm. The coupled components M1 and M2 of the $CH_3$ group of lactic acid are 4.1 ppm and 1.3 ppm, whilst the corresponding components L1 and L2 of the lipids are at 1.4 and 0.9 ppm.

Figure 4:
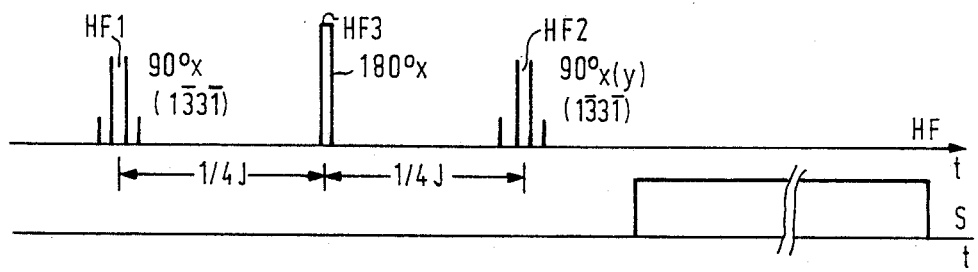
FIG. 4 shows the variation in time of a first version of the sequence in with the invention.

The first line of FIG. 4 shows the variation in time of the RF pulses in a sequence in accordance with the invention. The sequence commences with a frequency-selective RF pulse for water suppression in the form of a binomial 90° RF pulse HF1. As is known, a binomial RF pulse consists of a series of sub-pulses whose associated flip angles relate to one another in the same way as the binomial coefficients, each RF pulse rotating the nuclear magnetization in an opposite direction with respect to the preceding RF pulse. In the version shown in FIG. 4, the first binomial RF pulse HF1 is a so-called 1331 RF pulse. A flip angle of 11.25° is assigned to the first and the last sub-pulse of this binomial RF pulse, whilst a flip angle of 33.75° is assigned to the second and the third sub-pulse. When the frequency of the oscillator 40 corresponds exactly to the Larmor frequency of water, the water components in the examination zone are hardly excited by such a binomial RF pulse.

Just as the water components, all components in the examination zone whose Larmor frequencies are situated at a defined distance from the Larmor frequency of water, or at an integer multiple thereof, are substantially not excited either. For the components whose Larmor frequencies are situated in the centre between the substantially suppressed Larmor frequencies, such a binomial RF pulse acts as a 90° pulse. Said frequency distance is determined by the distance in time between the sub-pulses. It corresponds to twice the reciprocal value of the distance in time between two successive sub-pulses. For a magnetic induction of 1.5 T, the frequency difference between the frequency components W and M2 amounts to approximately 217 Hz and double this value amounts to 434 Hz. The reciprocal value of 434 Hz corresponds to approximately 2.3 ms. Thus, when the first sub-pulses of the first binomial RF pulse HF1 are spaced 2.3 ms apart, on the one hand the water component W and the neighbourinq lactic acid component M1 are substantially not excited, whilst the nuclear magnetization of the second lactic acid component M2, but also of the interrelated lipid components L1, L2, is rotated through 90°. This is denoted by the broken curve F in FIG. 3.

Thus, after the first binomial 90° RF pulse HF1, the components M2 and L1 and L3 are excited, but also the non-coupled components stemming from the $CH_2$ groups in the lipids and situated in the vicinity of M2.

The first binomial RF pulse HF1 is followed by a 180° RF pulse HF3 which rotates the nuclear magnetization (in a co-ordinate system which rotates in the same direction at the Larmor frequency) about the same axis as the first and the third sub-pulse of HF1. The RF pulse HF3 is a so-called "hard" pulse, i.e. it has a comparatively large bandwidth (due to its short duration), so that all hydrogen protons in the examination zone are influenced thereby, regardless of their chemical binding The RF pulse HF3 succeeds the RF pulse HF1 at a distance in time which is equal to the reciprocal value of four times the scalar coupling constant J of lactic acid. Because this constant has a value of almost 7 Hz, a distance in time of approximately 35 ms results therefrom (measured from the time centre of the pulse HF1 to the time centre of the pulse HF3).

The 180° RF pulse HF3 is followed at the same time distance by a second binomial RF pulse HF2. The sub-pulses are spaced the same distance in time apart and have the same amplitude as the sub-pulses of the first binomial RF pulse HF1. The phase position of the pulse is of essential importance:

When the phase position of the sub-pulse of the binomial RF pulse HF2 corresponds to that of the sub-pulse of HF1, all signals stemming from the non-coupled lipid components in the frequency range of M2 (not shown in FIG. 3) are suppressed. Moreover, the coupled components L1 and L2 are brought into a multiple quantum coherence state in which they cannot produce noticeable signals. Only the lactic acid component M2 is brought into a single quantum coherence state in which it produces a noticeable signal, because the lactic acid component M1 coupled thereto is substantially not excited by the first binomial RF pulse HF1. Thus, in this phase position of the second RF pulse HF2 the presence or the concentration of lactic acid in the examination zone can be determined. To this end, subsequent to the second binomial RF pulse the switch 12 (see FIG. 2) is switched to the position shown in the drawing in which it is enabled by a signal S from the clock pulse generator, so that the nuclear resonance signal generated in the examination zone is converted into a series of digital data words. The frequency spectrum is determined from these data words in known manner by Fourier transformation.

When the phase position of the second binomial RF pulse is shifted 90° with respect to that of the first binomial RF pulse HF1 (i.e. when the nuclear magnetiZation in a co-ordinate system which rotates in the same direction at the Larmor frequency is rotated about an axis which encloses an angle of 90° with respect to the axis of rotation of HF1), the lactic acid components M2 and the coupled lipid components L1 and L2 are brought into a quantum coherence state in which they do not produce a noticeable signal. The non-coupled lipid components in the vicinity of M2 are substantially not influenced by the second binomial RF pulse HF2, so that they produce a nuclear resonance signal which is evaluated in the same way as described above. Thus, the presence of lipids in the examination zone can be demonstrated in this phase position.

In order to create the phase position of HF2 which is shifted 90° with respect to HF1, it is merely necessary to rotate the phase position of the oscillator signal through 90° for HF2. This could be achieved by applying the output signal of the 90° phase shifter 48 to the input of the mixer 43 instead of the output signal of the oscillator 40 However, under the control of the control unit 15 alternatively the oscillator frequency can be varied until a phase shift of 90° is obtained with respect to the original oscillator oscillation.

The sequence shown in FIG. 4 enables determination of the lactic acid or lipid contents only within the total examination zone. In many cases, however, it is desirable to determine the lactic acid contents or the lipid contents in a limited part of the examination Zone, i.e. in a given body region of the patient arranged in the examination zone. Furthermore, in practice the water signal (i.e. the nuclear resonance signal caused by excitation of the nuclear spins of water) cannot be completely suppressed by means of the sequence shown in FIG. 4; the resultant water signal is still substantially larger than the lactic acid or lipid signal.

Figure 5:
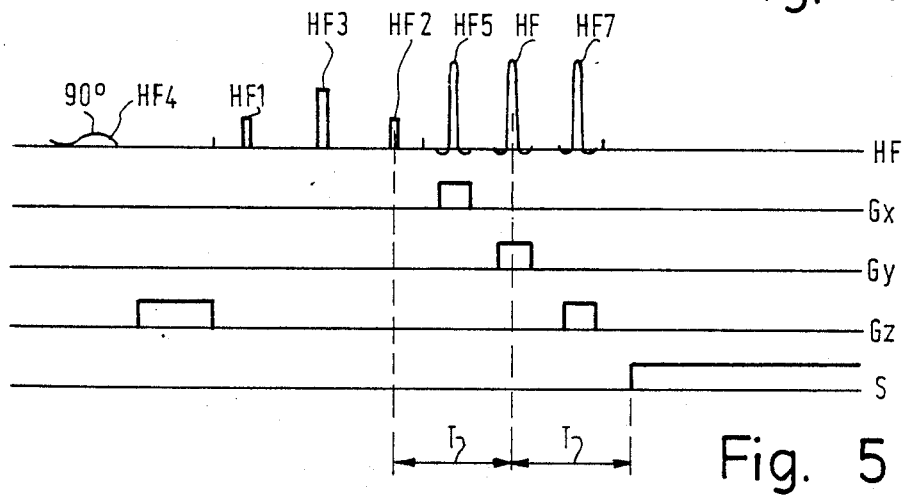
FIG. 5 shows the variation in time of the RF pulses and the magnetic gradient fields in a second version.

Therefore, in FIG. 5 a "weak" 90° RF pulse HF4 is applied before the beginning of a sequence. The duration of this pulse is comparatively long, resulting in a comparatively small bandwidth so that throughout the entire examination zone at only the water component W is excited, but not the components L1, L2 and M2. After the RF pulse HF4 but before the RF pulse HF1 a magnetic gradient field Gz (third line, FIG. 5) is applied in order to dephase the nuclear magnetization. Consequently, the water component in the spectrum excited by the RF pulses HF1 ... HF3 is further suppressed. This part of the sequence, preceding the actual excitation, can be dispensed with, however, when the water component is already adequately suppressed by the sequence itself.

After the second binomial RF pulse HF2 there are applied three selective 180° RF pulses HF5, HF6 and HF7. During each of these RF pulses a magnetic gradient field is applied, the direction of the magnetic gradient field being rotated 90° from one pulse to another (see lines 2 to 4). These three RF pulses are situated at the same distance from one another, which distance may be substantially smaller than the distance from the preceding sequence, which is contrary to the representation in FIG. 5. As is described in detail in German Patent Application P 37 25 800.1, all spin resonance signals which do not originate from a volume determined by the frequency and the bandwidth of the RF pulses and by the magnitude and duration of the magnetic gradient field are thus suppressed. This enables, using Fourier transformation of the nuclear resonance signal samPled subsequent to these three pulses (see line 5 of FIG. 5), the determination of the lactic acid contents or the lipid contents in a defined body region, for example a part of the brain.

The best results are obtained when the distance in time T from the centre of the second binomial RF pulse HF 2 to the centre of the central pulse HF6 of the three Pulses satisfies the condition $T=(n+1/2)/2J$, where n is an integer, and when the distance between HF6 and the sampling interval also amounts to T.

In practice the RF pulse HF3 is not an ideal 180° pulse, i.e. the magnitude of the flip angle does not amount to 180° everywhere in the examination zone or in the selected volume. As a result, errors occur in the measured spectrum. This measurement, for which the sequence shown in FIG. 5, is repeated many times, for example 128 times, the resultant nuclear resonance signals being added and only the nuclear resonance sum signal being subjected to a Fourier transformation can be corrected by rotating the 180° RF pulse HF3 in the opposite sense in every other sequence. To this end, the phase in time of the oscillator signal must be rotated through 180° from one sequence to another. This can be realized in various ways, for example by multiplying the envelope signal from the memory 14 by the factor −1 every other sequence, or by varying the frequency before the RF pulse HF3 until a phase shift of 180° is obtained. However, it is also possible to use an oscillator which comprises a non-inverting output in addition to an inverting output, and by alternately connecting, from one sequence to another, the outputs to the input of the mixing circuit 43.

The invention has been described with reference to binomial 90° RF pulses HF1 and HF2. However, instead use can be made of other frequency-selective pulses which do not excite water-bound hydrogen protons in the examination zone, for example so-called DANTE pulses (see Morris et al in J. Magn. Reson.; 29, page 433, (1978)).

What is claimed is:

1. A magnetic resonance spectroscopy method for demonstrating the presence of lactic acid or lipids in which an examination zone is exposed in the presence of a steady magnetic field to a sequence which comprises a first frequency-selective RF pulse (HF1) acting as a 90° RF pulse for water suppression, followed by a non-selective 180° RF pulse (HF3) which is followed by a second frequency-selective RF pulse (HF2) also acting as a 90° RF pulse for water suppression, wherein a first distance in time between the first frequency-selective RF pulse (HF1) and the non-selective 180° RF pulse (HF3) is the same as a second distance in time between said non-selective 180° RF pulse (HF3) and the second frequency-selective RF pulse (HF2), said first and second distances in time being approximately equal to the reciprocal value of four times the scalar coupling constant J of lactic acid.

2. The method as claimed in claim 1, characterized in that for demonstrating the presence of lactic acid the first and second frequency-selective RF pulses (HF1, HF2) have the same phase position.

3. The method as claimed in claim 1, characterized in that in order to demonstrate the presence of lipids, the phase positions of the first and second frequency-selective RF pulses (HF!, HF2}are shifted through 90° with respect to one another.

4. The method as claimed in claims 1, 2 or 3 characterized in that the second frequency-selective RF pulse is followed by three 180° RF pulses (HF5, HF6, HF7) in the presence of a respective magnetic gradient field (Gx, Gy, Gz), the gradients of the magnetic gradient fields applied during these 180° RF pulses extending perpendicularly to one another.

5. The method as claimed in claims 1, 2 or 3 characterized in that the first frequency-selective RF pulse (HF1) is preceded by a narrow-band 90° RF pulse (HF4) having a frequency which corresponds to the Larmor frequency of water, between this narrow-band RF pulse 90° (HF4) and the first frequency-selective RF pulse (HF1) there being applied a magnetic gradient field (Gz) for the purpose of dephasing.

6. The method as claimed in claims 1, 2 or 3 characterized in that the 180° RF pulse (HF3) situated between the first and second frequency-selective RF pulses is inverted every other sequence.

7. The method as claimed in claims 1, 2 or 3 characterized in that the first and second frequency-selective RF pulses are binomial RF pulses.

8. The method as claimed in claim 4, characterized in that the distance in time T between the centre of the second frequency-selective RF pulse (HF2) and the centre of the second one (HF6) of the three RF pulses (HF5, HF6, HF7) satisfies the condition:

$$T=(n+1/2)/2J,$$

where n is a positive integer, the nuclear resonance signal occurring at the instant T after the second one (HF6) of the three RF pulses being detected and further processed.

9. Apparatus for determining the spectral distribution of the nuclear magnetization within an examination zone for demonstrating the presence of lactic acid or lipids comprising: means (1) for generating a uniform, steady magnetic field, an RF coil system (11) for generating RF pulses and for detecting nuclear resonance signals which are generated in the examination zone in response thereto, a processing device (17) for deriving a spectrum from the nuclear resonance signals detected, and a control unit (15), characterized in that the control unit (15) is constructed so that it generates at least one sequence in which a first frequency-selective RF pulse (HF1) acting as a 90° RF pulse for water suppression is succeeded by a non-selective 180° RF pulse (HF3) which itself is followed by a second frequency-selective RF pulse (HF2) also acting as a 90° RF pulse for water suppression, a first distance in time between the first frequency-selective RF pulse (HF1) and the non-selective 180° RF pulse (HF3) being the same as a second distance in time between the non-selective 180° RF pulse (HF3) and the second frequency-selective RF pulse (HF2), said first and second distances in time being approximately equal to the reciprocal value of four times the scalar coupling constant J of lactic acid.

10. The method as claimed in claim 9, characterized in that for demonstrating the presence of lactic acid the first and second frequency-selective RF pulses (HF1, HF2) have the same phase position.

11. The method as claimed in claim 9, characterized in that in order to demonstrate the presence of lipids, the phase positions of the first and second frequency-selective RF pulses (HF1, HF2 are shifted through 90° with respect to one another.

12. The apparatus of claim 9, characterized in that for demonstrating the presence of lactic acid the two frequency-selective RF pulses have the same phase position.

13. The apparatus of claim 9, characterized in that in order to demonstrate the presence of lipids, the phase positions of the two frequency-selective RF pulses are shifted through 90° with respect to each other.

* * * * *